United States Patent
Shiue et al.

[11] Patent Number: 5,953,601
[45] Date of Patent: Sep. 14, 1999

[54] ESD IMPLANTATION SCHEME FOR 0.35 μM 3.3V 70A GATE OXIDE PROCESS

[75] Inventors: Ruey-Yun Shiue; Chin-Shan Hou; Yi-Hsun Wu; Lin-June Wu, all of Hsin-Chu, Taiwan

[73] Assignee: Taiwan Semiconductor Manufacturing Company, Ltd., Hsin-Chu, Taiwan

[21] Appl. No.: 09/024,480

[22] Filed: Feb. 17, 1998

[51] Int. Cl.[6] ................ H01L 21/8238; H01L 21/8236
[52] U.S. Cl. ............................. 438/200; 438/275
[58] Field of Search .................... 438/200, 275, 438/199, 229, 231, 279, 592, 682, FOR 216, FOR 218

[56] References Cited

U.S. PATENT DOCUMENTS

| | | | |
|---|---|---|---|
| 4,717,684 | 1/1988 | Katto et al. | 438/200 |
| 5,489,792 | 2/1996 | Hu et al. | 257/347 |
| 5,493,142 | 2/1996 | Randazzo et al. | 257/328 |
| 5,532,178 | 7/1996 | Liaw et al. | 437/57 |
| 5,559,352 | 9/1996 | Hsue et al. | 257/328 |
| 5,672,527 | 9/1997 | Lee | 438/275 |
| 5,744,839 | 4/1998 | Ma et al. | 257/356 |

*Primary Examiner*—Michael Trinh
*Attorney, Agent, or Firm*—George O. Saile; Stephen B. Ackerman

[57] ABSTRACT

A method is disclosed for improving the ESD protection of gate oxide in ultra large scale integrated circuits of 0.35 μm technology or less, approaching 0.25 μm. This is accomplished by providing a silicon substrate and forming thereon product FET device circuits and ESD protection device circuits. In forming the ESD source/drain regions, the implantation species is changed from phosphorous to boron, thereby reducing junction breakdown voltage. Ion implantation is performed judiciously in areas with high leakage and capacitance. Hence improvement is accomplished though reduced breakdown voltage, as well as through reduced leakage and capacitance of the junction. Furthermore, ion implantation is performed using a photoresist mask prior to the formation of silicidation over the contact area. This avoids the problem of silicide degradation and the concomitant increase in contact resistance through the transportation of metal ions into depletion region of junction during high energy ESD implantation.

9 Claims, 5 Drawing Sheets

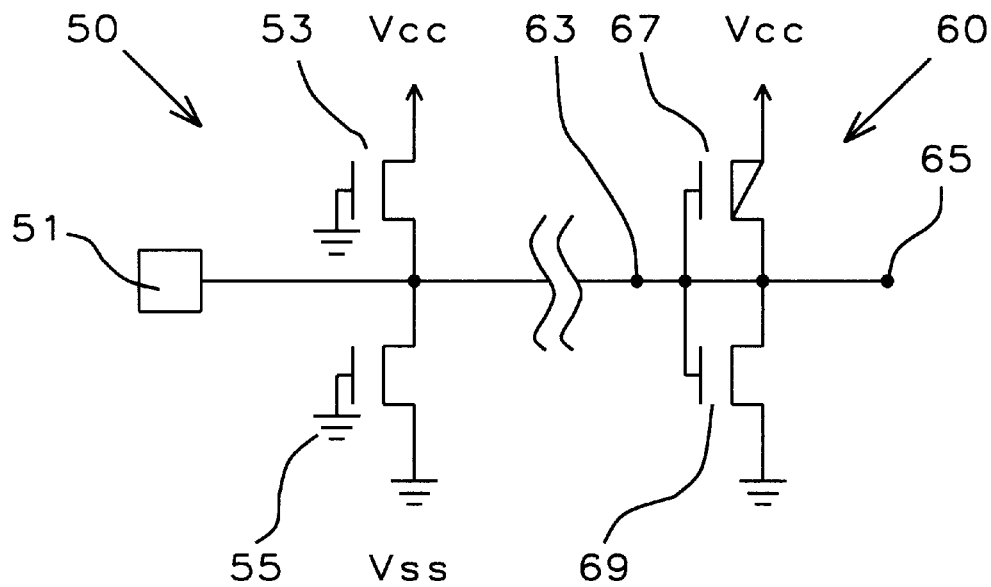
*FIG. 1a - Prior Art*
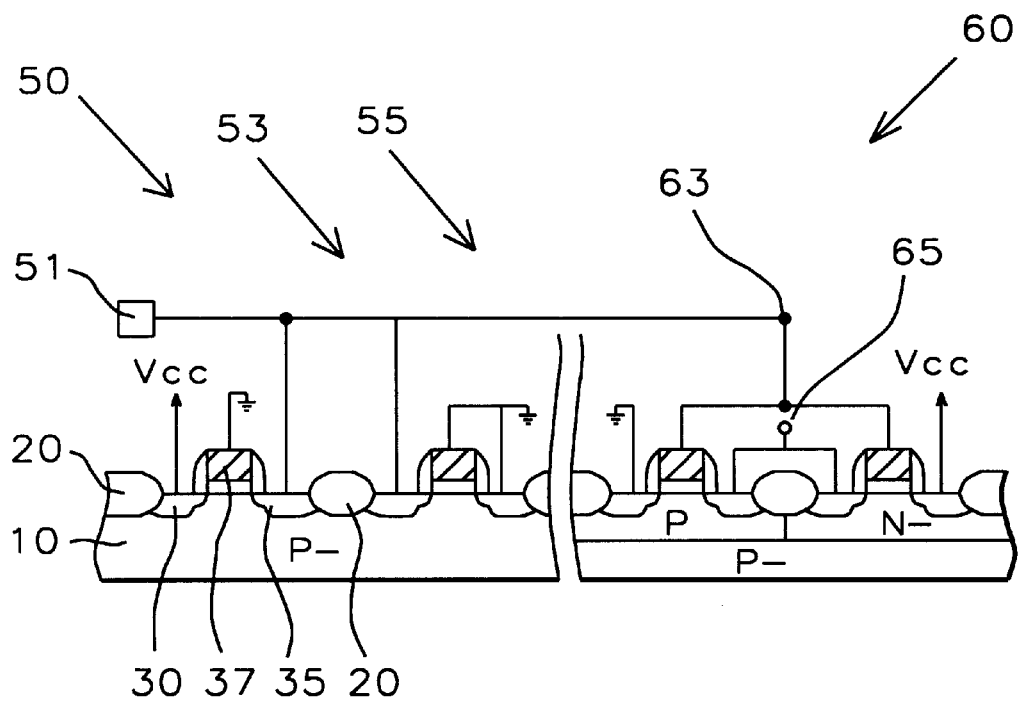
*FIG. 1b - Prior Art*

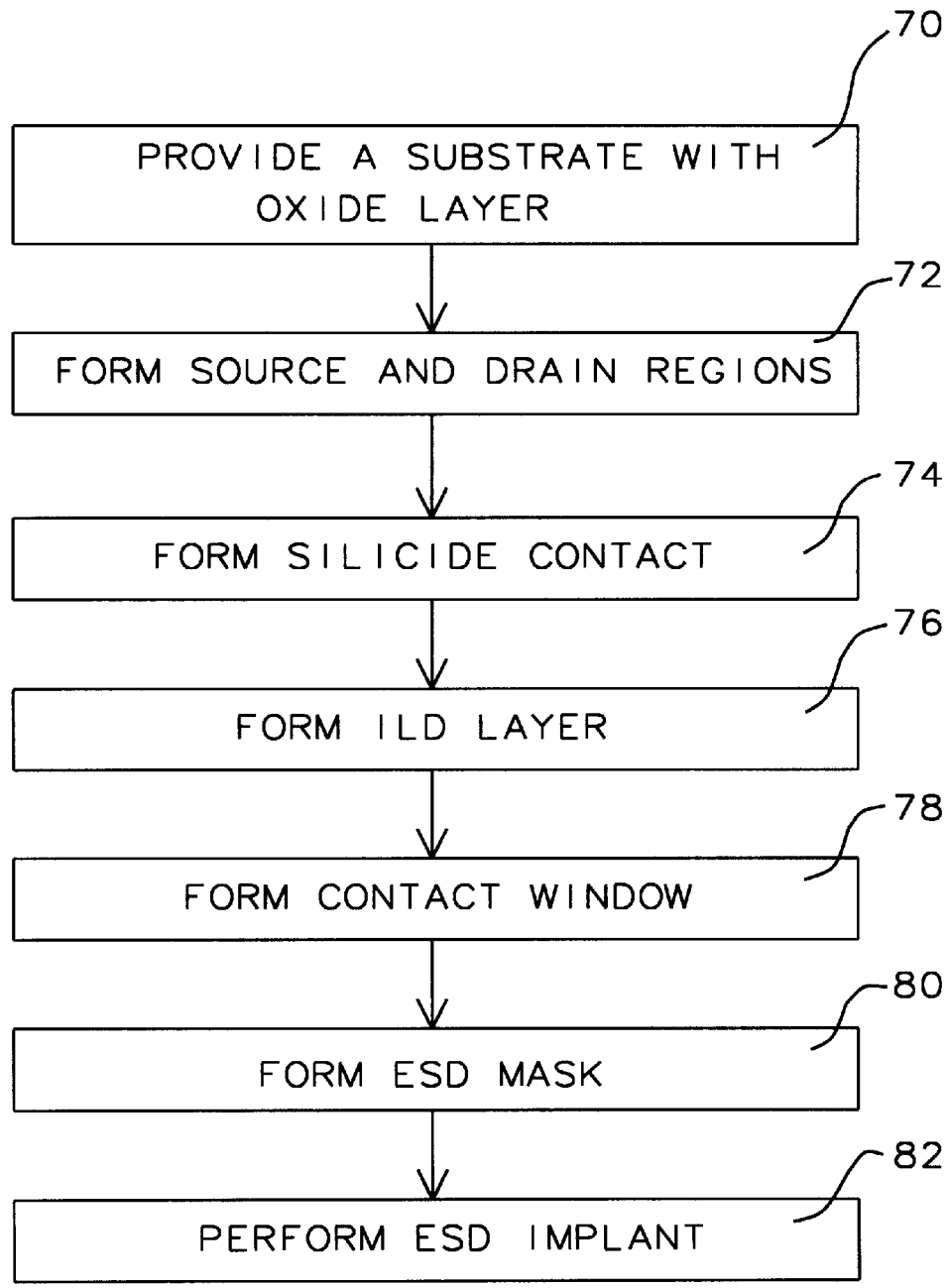
FIG. 1c – Prior Art

ESD IMPLANTATION SCHEME FOR 0.35 μM 3.3V 70A GATE OXIDE PROCESS

BACKGROUND OF THE INVENTION (1) Field of the Invention

The present invention relates to manufacturing of semiconductor devices in general, and in particular, to a method of improving the ESD protection of gate oxide in ultra large scale integrated circuits of 0.35 μm technology or less, approaching 0.25 μm.

(2) Description of the Related Art

Electrostatic discharge (ESD) occurs when a relatively large amount of voltage usually generated by tribo(rubbing) electricity is released suddenly. For example, a person taking an integrated circuit from its plastic wrapping materials or walking across a room can generate up to 20,000 V. Such an unintended discharge into a metal oxide semiconductor field effect transistor (MOSFET) can cause immediate damage to the circuit or subsequent early life failure.

The elements that initially encounter an ESD pulse in an integrated circuit are typically input and/or output buffers that are directly connected to bond pads or terminals on a chip which are exposed to the external environment. The discharge can find its way to the gate, drain or the source, although the source is typically connected to a power supply and is unlikely to supply an ESD pulse. Whether the ESD pulse traverses the gate or the drain, it can ultimately cause a breakdown of the dielectric gate oxide barrier between the gate and the channel in an FET device by leaving a conductive path of ionized dielectric or trapped electrons, or by burning a hole in the gate oxide. Even if the ESD pulse does not flow directly between the gate and the drain, an electronic ripple from this pulse may destroy the gate oxide layer, which breaks down at 20 volts or less. The destruction of the gate oxide renders the circuit, chip, and often the device containing the chip nonfunctional.

The function of a prior art ESD device in protecting an internal FET device in an integrated circuit is depicted in the circuit diagram of FIG. 1a which is also described in U.S. Pat. No. 5,559,352. ESD protection device (50) is connected to input or output (I/O) pad (51), and consists of two NMOS devices (53) and (55). It is through pad (51) that electrostatic charges may enter the integrated circuit from an exterior source such as a person handling the device. The NMOS transistor (53) has its source connected to Vcc, a voltage source. At the same time, its (53) drain is connected to the drain of NMOS (55), and to the I/O pad (51), as well as to the internal circuit (60) the ESD is designed to protect. The gates of transistors (53) and (55) as well as the source of (55) are connected to ground.

The internal device that is to be protected on the same IC chip is shown to be a CMOS inverter (60) in FIGS. 1a and 1b, though other circuits could be protected by the same ESD device. This inverter has its input (63) connected to the gates of P-channel transistor (67) and N-channel transistor (69). The P-channel source is connected to Vcc, while the N-channel source is connected to ground. The drains of the two transistors are connected together and provide the output terminal of the inverter. A cross-sectional representation of the circuit diagram in FIG. 1a, and connections, is shown in FIG. 1b where drain, source and gate are schematically labeled as (30), (35) and (37), respectively on substrate (10) and isolated with field oxide (20).

There are several methods available in prior art to mitigate the occurrence of ESD. The simplest method is to increase the thickness of the gate oxide material, $SiO_2$. However, this would be contrary to the trend in technology where the gate oxide thickness is being reduced continuously because the speed of the devices is inversely proportional to that thickness. The gate oxide in present circuits is approximately 100 angstroms, Å, thick or less and will be thinner in future circuits. Normally, the dielectric breakdown strength of silicon dioxide ($SiO_2$) is 8 MV/cm. Therefore, a 100 Å thick gate oxide will not sustain voltages more than about 8 volts. In actual practice, gate oxides are thinner than 100 Å and process variables make the gate oxides thinner in spots causing the actual sustainable voltage to be well below 8 V. Furthermore, this 8 V breakdown is less than the junction breakdown voltages. Thus, gate oxide will breakdown before the junction does. This is especially a problem with ESD protection devices because ESD transient operating voltages are higher than the gate oxide breakdown voltage. When the gate oxide in the protection circuit breaks down, the ESD protection circuit does not function to protect the device circuit. It is conceivable to have thicker gate oxide thickness for ESD protective devices while keeping the thinner thickness for input product devices, the conventional one step gate oxidation process does not permit variable thicknesses on the same wafer. Therefore, other methods must be sought to provide electrical strength for the relatively thin gate oxides of the more recent ultra high speed circuits of today.

In U.S. Pat. No. 5,532,178, Liaw, et al, propose a method that will provide a higher gate oxide breakdown voltage than the drain junction breakdown voltage on ESD circuit transistors while maintaining thin gate oxide thickness for product CMOS device circuits. The improvement consists of fabricating an NMOS ESD circuit with an undoped polysilicon gate electrode combined with CMOS devices which may have doped gate electrode. The undoped polysilicon gate electrode of the ESD transistor increases the gate oxide breakdown voltage thus making the ESD transistor able to withstand a greater voltage discharge and therefore providing better protection to the product devices.

The approach taken by Hsue of U.S. Pat. No. 5,559,352 is the opposite of the previous approach in that rather than increasing the breakdown voltage of the gate oxide, the junction breakdown voltage of the ESD protection device is reduced. Thus, it is again the junction that is made to fail before the breakdown of the gate oxide. This is accomplished by forming a deeper and lighter ion implanted region of opposite conductivity centered under the source and drain regions of the ESD device, thereby lowering the level of drain junction breakdown.

Instead of adding protective circuits, which occupy valuable chip area, a still another approach protects an integrated circuit chip from ESD events by adding a series resistance between a source and drain of input or output transistors connected to bond pads of the chip. As described by Randazzo, et al, in U.S. Pat. No. 5,493,142, the series resistance is designed to raise the voltage of localized current path between the source and drain above a trigger voltage at which ESD conduction across the channel initiates. By raising the voltage of this path above the trigger voltage, ESD conduction is induced in adjacent paths. Thus, instead of ESD conduction being concentrated along a localized path between the source and drain, which typically burns a hole along the path that destroys the transistor and renders the chip nonfunctional, ESD conduction is encouraged to spread across the channel width, which is designed to be large enough to absorb and ESD pulse without damage. According to the same patent, the actual forming of the series resistance is accomplished by doping a substrate masked by a gate and then forming and selectively etching an oxide layer covering the gate, source and drain of the transistor during manufacturing such that a sidewall oxide spacers is extended outward from the gate toward the drains a measured amount. The selective etching of that oxide layer exposes the surface of the substrate at ends of the sidewall oxides proximal to the gate, allowing the formation of source and drain regions and contacts thereto. A lightly doped region of the substrate is left under the extended sidewall oxide, providing a resistance in series between the drain and the channel. It is taught by Randazzo that this added series resistance mitigates ESD damage.

Yet another prior art approach provides the forming of transistor devices in electrically and physically isolated islands. This technique is especially amenable to silicon-on-insulator (SOI) technology where silicon film on an insulator can be delineated easily to form the desired islands as described in U.S. Pat. No. 5,489,792. Each island then has at least one conducting path which is capable of absorbing some amount of ESD energy. The total ESD energy is thus spread among the isolated regions, whereas in a contiguous bulk transistor, the ESD current tends to concentrate in few paths which can lead to device failure.

Each one of these methods of forming ESD protective devices has the advantages cited above, but applicable only to semiconductor lithographic technologies of 1-micron ($\mu$m) or greater where the gate oxide thicknesses are 100 Å or more. However, for advanced sub-micron technologies of today where speed and packing density are critical, the gate oxide thicknesses are becoming much less than 100 Å. It is disclosed in the present invention an ion implanting method of forming ESD devices for technologies supporting feature sizes under ½-micron. It is also disclosed that by this method, junction areas of high leakage current and high capacitance are advantageously avoided. Furthermore, the method disclosed here prevents the formation of contacts of higher contact resistances that are usually experienced with prior art methods.

SUMMARY OF THE INVENTION

It is therefore an object of this invention to provide a method of forming an electrostatic discharge (ESD) protecting device having a reduced junction breakdown voltage.

It is another object of this invention to provide a method of protecting ultra scale integrated circuits of advanced 0.5 $\mu$m technologies from ESD phenomenon.

It is still another object of this invention to provide a method of minimizing current leakage and capacitance of device junctions in integrated circuits.

It is yet another object of this invention to provide a method of forming ESD devices without the formation of contacts of higher contact resistances that are usually experienced with prior art methods.

These objects are accomplished by providing a silicon substrate and forming thereon product FET device circuits and ESD protection device circuits. In forming the ESD source/drain regions, the implantation species is changed from phosphorous to boron, thereby reducing junction breakdown voltage. Ion implantation is performed judiciously in areas with high leakage and capacitance. Hence improvement is accomplished though reduced breakdown voltage, as well as through reduced leakage and capacitance of the junction. Furthermore, ion implantation is performed using a photoresist mask prior to the formation of silicidation over the contact area. This avoids the problem of silicide degradation and the concomitant increase in contact resistance through the transportation of metal ions into depletion region of junction during high energy ESD implantation.

BRIEF DESCRIPTION OF THE DRAWINGS

FIG. 1a is a circuit diagram showing the electrical connections between an ESD protection device and an internal circuit formed in an integrated circuit of prior art.

FIG. 1b is cross-sectional of a substrate showing the physical structure of the ESD device and the internal circuit corresponding to the circuit diagram of FIG. 1a of prior art.

FIG. 1c is a diagram showing the steps of forming ESD devices according to conventional methods.

DESCRIPTION OF THE PREFERRED EMBODIMENTS

Figure 2A:
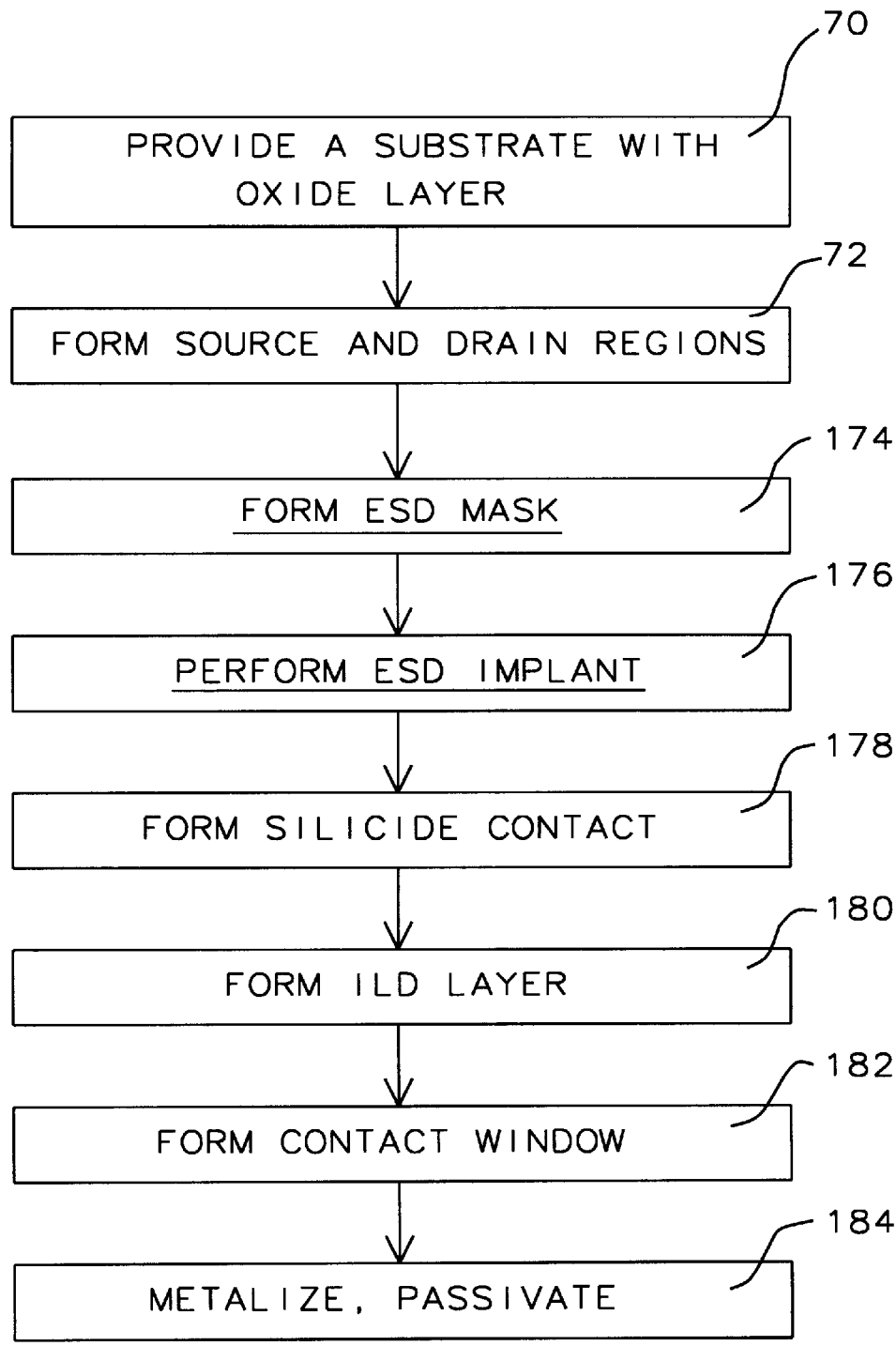
FIG. 2a is a diagram showing the steps of forming ESD devices according to the methods of this invention.

Referring now to the drawings, in particular to FIGS. 2a–2d, there are shown steps for forming ESD devices for 0.35 micrometer ($\mu$m) 3.3 volt (V) process without degrading contact electrical resistance and junction characteristics.

Figure 2B:
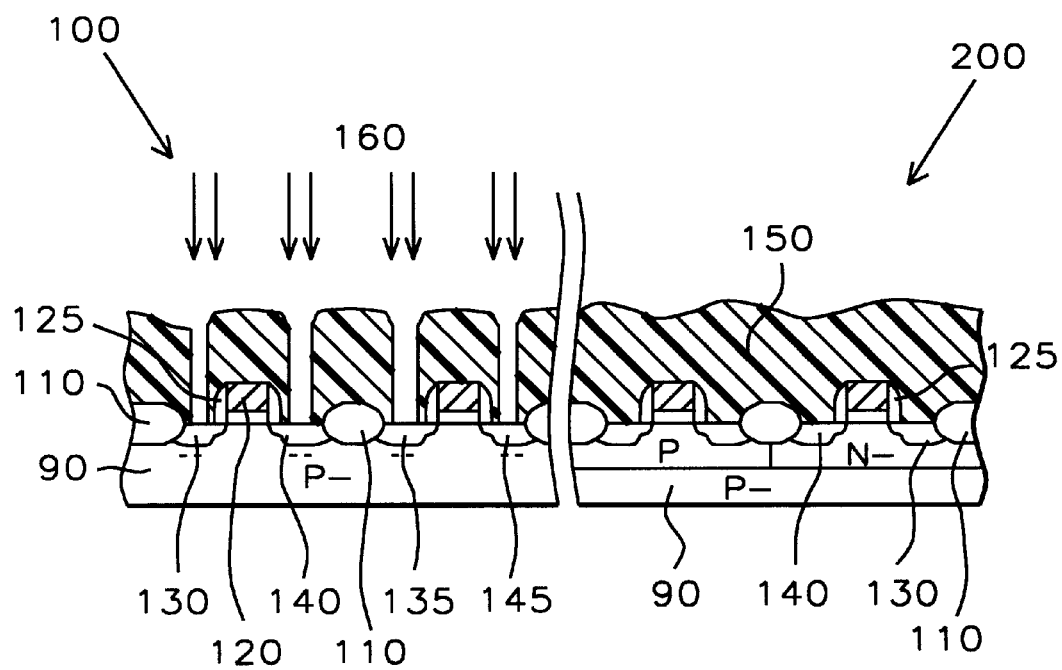
FIG. 2b is a cross-sectional view of a substrate showing the forming of the ESD device by boron implanting according to this invention.

In FIG. 2b, an ESD device (100) and an internal FET device (200) are shown. Both devices are formed at the same time on a single substrate (90). Field oxide regions (110) are formed employing conventional techniques, and serve to isolate devices from one another. Subsequent steps comprise thermal growing gate oxide layer, depositing thereon a polysilicon or polycide gate layer, and then patterning the latter layer to form a gate electrode (120) for each device consisting of a gate oxide and a gate. Then using the gate as a mask, source (130) and drain (140) regions are formed by performing ion implantation, preferably with arsenic at a heavy dosage between about $2\times10^{15}$ to $7\times10^{15}$ atoms/cm$^2$. A drive-in step is then used by heating to a temperature between about 20 to 50 minutes with the resultant lightly doped drain (LDD) structure being formed under spacers (125) as is well known in the art.

If conventional methods were to be followed next, metal contact, such as silicide or salicide, would be performed over the source/drain regions, a step (74) in FIG. 1c. In steps 70 and 72 of the same FIG. 1c, a substrate is provided, and source and drain regions are formed as describe above. Thus, in step 74, metal is deposited over an FET device structure, and reacted with the exposed silicon areas of the source and drain, as well as the exposed polysilicon areas on the gate, to form a silicide and polycide, respectively. This is accomplished after forming oxide spacers on the sidewalls of the gate to isolate it from the source/drain regions, as is well known in the art. Then the final structure of the device is formed by chemical vapor depositing an interlevel dielectric (ILD), step (76), patterning the same for a contact window, dry etching the ILD to contact the underlying metal silicide, step (78). Upon reaching this point, an extra masking step (80) would be used to pattern the ESD devices and mask the internal FET device. An implant would then be performed, step (82), through contact openings into the active regions of the ESD protection device. The implant has the effect of reducing the junction breakdown voltage. These prior art steps are shown diagrammatically in FIG. 1c.

It has been observed in the present state of the manufacturing line that performing ion implantation into the active regions after forming silicide contacts has the detrimental effect of transporting metal ions into depletion region of the p/n junction. This also has the effect of degrading the silicide and, therefore, raising the contact resistance. It is disclosed in this invention that it is advantageous to perform the ion implanting of the ESD regions prior to the contact silicidation as shown diagrammatically in FIG. 2a, and schematically in FIGS. 2b–2d.

The disclosed embodiment departs from prior art methods after the forming of source/drain regions, that is, after steps 70 and 72 of FIGS. 1c and 2a. Thus in FIG. 2a, prior to the silicidation step (178), a photoresist layer (150), shown in the corresponding cross-sectional FIG. 2b, is formed and ESD device patterned (step 174) to mask the internal FET devices (200) from the damaging effects of implant ions. It is preferred that the photoresist layer has a thickness between about 1 to 1.2 micrometers ($\mu$m). It will be appreciated by those skilled in the art that photoresist has better characteristics than oxides in protecting the underlying devices from ion bombardment.

As a main feature and key spirit of the present invention, ESD implant is next performed preferably with boron at a dosage level between about $1 \times 10^{13}$ to $7 \times 10^{13}$ atoms/cm$^2$ and energy between about 50 to 55 KEV (thousand electron volts). The implant ions (160) form regions (135) and (145) below source (130) and drain (140) regions, respectively, shown in FIG. 2b. Adding regions (135) and (145) increase the substrate impurity concentration at the p/n junctions between the ESD device active regions and the substrate, and thus decreases the junction breakdown voltage. This follows from the well known phenomenon that the breakdown voltage of a p/n junction is inversely proportional to the substrate impurity concentration. The net effect is to reduce the junction breakdown voltage of the device from a normal range between about 8 to 10 volts to a lower value between about 5 to 7 volts. Consequently, the reduction in junction breakdown voltage improves the ESD characteristics of the device because more current is now discharged through the protection device for a given amount of power. The faster the discharge through the ESD device, the better is the protection of the internal devices from damages.

Figure 2C:
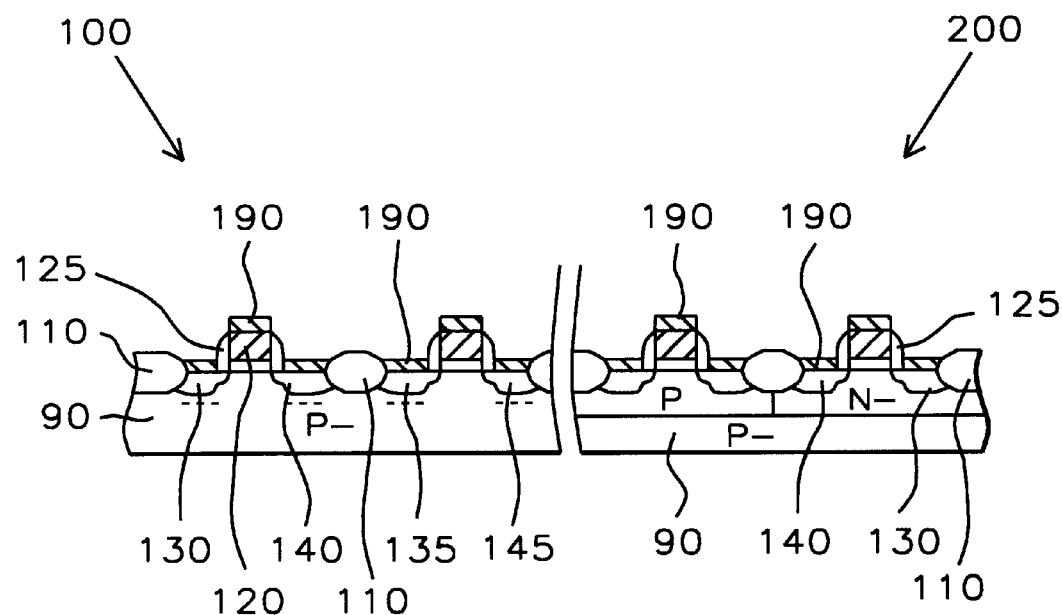
FIG. 2c is a cross-sectional view of a substrate showing the forming of silicide contact after the forming of the ESD device according to this invention.
Figure 2D:
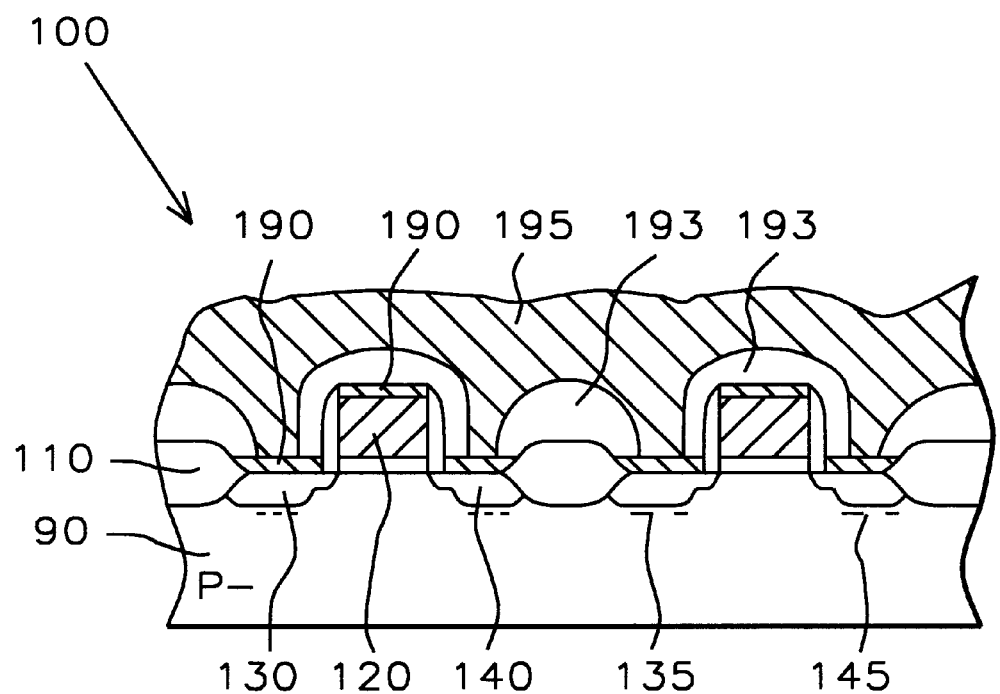
FIG. 2d is a cross-sectional view of a substrate showing the forming of an interconnecting metallurgy to complete the fabrication of the ESD device of this invention.

After the ESD implant, photoresist layer (150) is removed from the substrate and another key step (178) of the invention is performed where self-aligned silicide, or salicide contact (190), is formed over the source/drain regions, and gate (120) as shown FIG. 2c. It is preferred that the silicide is formed by silicidation of tungsten to from tungsten silicide (Wsi$_2$) and has a thickness between about 1000 to 3000 angstroms (Å). This is followed by steps (180) and (182) of FIG. 2a comprising the chemical vapor deposition of an interlevel dielectric (193), patterning the same for a contact window, dry etching the ILD (step 182) to contact the underlying metal silicide (190) over the source/drain regions shown in FIG. 2d. Further processing then takes place to complete the circuit, by continuing with processing as is well known in the art, that is, metallization (195) (shown in FIG. 2d), passivation (not shown), etc., as indicated in step (184) of FIG. 2a.

It will be noted above that the problem of driving metal ions into the p/n junction has been avoided by performing the ESD implant prior to the forming of metal contacts. This has the important advantage of preventing the degradation of the contact resistance. Similar results can be obtained without necessarily employing the specific details given here.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming an ESD protection device for 0.35 $\mu$m, 3.3V, 70 Å gate oxide process comprising the steps of:

providing a substrate having gate, source and drain regions, and field oxide regions in ESD regions, and having internal devices comprising gate, source and drain regions, and field oxide regions;

providing oxide spacers adjacent to sidewalls of said gates;

first implanting of ions in said source and drain regions using said gates and said oxide spacers as a mask;

depositing a layer of photoresist over the substrate;

forming an ESD mask from the layer of photoresist to cover regions comprising said internal devices in said substrate, and to form openings in said ESD mask over said ESD regions;

second implanting of ions in said source and drain regions over said ESD regions through said openings in said ESD mask;

removing said ESD mask;

forming salicide contact over said source and drain regions and said gates;

depositing interlevel dielectric (ILD) layer on said substrate and said salicide contact;

forming holes in said ILD; and depositing metal in said holes to complete the process.

2. The method of claim 1, wherein said substrate is silicon.

3. The method of claim 1, wherein said first implanting is accomplished with arsenic at a dosage between about $2 \times 10^{15}$ to $7 \times 10^{15}$ atoms/cm$^2$.

4. The method of claim 1, wherein said layer of photoresist has a thickness between about 1 to 1.2 micrometers ($\mu$m).

5. The method of claim 1, wherein said forming of said ESD mask is accomplished by patterning said layer of photoresist.

6. The method of claim 1, wherein said second implanting is accomplished with boron at a dosage level between about $5 \times 10^{13}$ to $7 \times 10^{13}$ atoms/cm$^2$.

7. The method of claim 6, wherein said dosage level of said second implanting is performed at an energy level between about 50 to 55 KEV.

8. The method of claim 1, wherein said salicide is self-aligned tungsten silicide.

9. The method of claim 8, wherein said tungsten silicide has a thickness between about 1000 to 3000 angstroms (Å).

* * * * *